(12) United States Patent
Dong et al.

(10) Patent No.: US 8,116,140 B2
(45) Date of Patent: Feb. 14, 2012

(54) SAW-SHAPED MULTI-PULSE PROGRAMMING FOR PROGRAM NOISE REDUCTION IN MEMORY

(75) Inventors: Yingda Dong, San Jose, CA (US);
Yupin K. Fong, Fremont, CA (US);
Gerrit Jan Hemink, Yokohama (JP)

(73) Assignee: SanDisk Technologies Inc., Plano, TX (US)

( * ) Notice: Subject to any disclaimer, the term of this patent is extended or adjusted under 35 U.S.C. 154(b) by 196 days.

(21) Appl. No.: 12/757,399

(22) Filed: Apr. 9, 2010

(65) Prior Publication Data
US 2011/0249504 A1 Oct. 13, 2011

(51) Int. Cl.
*G11C 16/04* (2006.01)
(52) U.S. Cl. .............. 365/185.19; 365/185.22; 365/206; 365/185.17
(58) Field of Classification Search ............. 365/185.19, 365/185.22, 206, 185.17
See application file for complete search history.

(56) References Cited

U.S. PATENT DOCUMENTS

| | | | |
|---|---|---|---|
| 5,956,272 A | 9/1999 | Roohparvar | |
| 5,978,268 A | 11/1999 | Zink et al. | |
| 6,108,238 A * | 8/2000 | Nakamura et al. | 365/185.22 |
| 6,243,290 B1 | 6/2001 | Kurata et al. | |
| 6,621,737 B2 | 9/2003 | Naura et al. | |
| 6,882,567 B1 | 4/2005 | Wong | |
| 7,499,338 B2 * | 3/2009 | Ito | 365/185.3 |
| 7,656,701 B2 | 2/2010 | Lee et al. | |
| 2002/0071314 A1 * | 6/2002 | Sakakibara et al. | 365/185.22 |
| 2006/0221705 A1 * | 10/2006 | Hemink et al. | 365/185.28 |
| 2008/0084751 A1 * | 4/2008 | Li et al. | 365/185.19 |
| 2008/0158997 A1 * | 7/2008 | Hemink et al. | 365/185.22 |
| 2008/0316833 A1 | 12/2008 | Fong et al. | |
| 2009/0080263 A1 | 3/2009 | Lee et al. | |

FOREIGN PATENT DOCUMENTS
EP 1074995 A1 2/2001

OTHER PUBLICATIONS

International Search Report & The Written Opinion of the International Searching Authority dated Jul. 5, 2011, International Patent Application No. PCT/US2011/031452.
Irrera et al, "Pulsed Tunnel Programming of Nonvolatile Memories", IEEE Transactions on Electron Devices, vol. 50, No. 12, Dec. 2003.

\* cited by examiner

*Primary Examiner* — Tuan T. Nguyen
(74) *Attorney, Agent, or Firm* — Vierra Magen Marcus & DeNiro LLP

(57) ABSTRACT

In a memory system, a programming waveform reduces program noise by using sets of multiple adjacent sub-pulses which have a saw-tooth shape. In a set, an initial sub-pulse steps up from an initial level such as 0 V to a peak level, then steps down to an intermediate level, which is above the initial level. One or more subsequent sub-pulses of the set can step up from an intermediate level to a peak level, and then step back down to an intermediate level. A last sub-pulse of the set can step up from an intermediate level to a peak level, and then step back down to the initial level. A verify operation is performed after the set of sub-pulses. The number of sub-pulses per set can decrease in successive sets until a solitary pulse is applied toward the end of a programming operation.

20 Claims, 8 Drawing Sheets

SAW-SHAPED MULTI-PULSE PROGRAMMING FOR PROGRAM NOISE REDUCTION IN MEMORY

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple, e.g., four or more, distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, as memory devices continue to be scaled down in size, accurate programming becomes more difficult.

BRIEF DESCRIPTION OF THE DRAWINGS

FIG. 1b is an equivalent circuit diagram of the NAND string of FIG. 1a.

FIG. 1c is a cross-sectional view of the NAND string of FIG. 1a.

FIG. 9c depicts an alternative set of sub-pulses, as an alternative to the sets of sub-pulses of FIG. 9a.

FIG. 9d depicts another alternative set of sub-pulses, as an alternative to the sets of sub-pulses of FIG. 9a.

FIG. 10 is a flow chart describing one embodiment of a method for programming non-volatile memory using sets of sub-pulses such as provided in FIG. 9a.

DETAILED DESCRIPTION

A method and non-volatile storage system are provided in which program noise is reduced by providing a programming waveform which uses sets of sub-pulses.

In a memory system, a programming waveform is applied to a selected set of non-volatile storage elements such as via a word line in a programming operation. The programming waveform includes sets of sub-pulses which have a saw-tooth shape. For instance, each set can include multiple adjacent sub-pulses, where no verify operation is performed between the sub-pulses in a set. The initial sub-pulse steps up from an initial level such as 0 V to a peak level, then steps down to an intermediate level, which is above the initial level. One or more subsequent sub-pulses of the set can step up from an intermediate level to a peak level, and then step back down to an intermediate level. A last sub-pulse of the set can step up from an intermediate level to a peak level, and then step back down to the initial level. A verify operation is performed after the set of sub-pulses has been applied. The use of repeated sub-pulses can reduce program noise while minimizing a performance impact due to the time savings which is realized by stepping up and down from an intermediate level which is above the initial level. Furthermore, the number of sub-pulses per set can decrease in successive sets until a solitary pulse is applied toward the end of a programming operation. This is acceptable since program noise is more tolerable for higher state storage elements which complete programming toward the end of the programming operation.

One example of a memory system suitable for implementing the present invention uses the NAND flash memory structure, which arranges multiple transistors in series between two select gates. The transistors in series and the select gates are referred to as a NAND string.

Figure 1A:
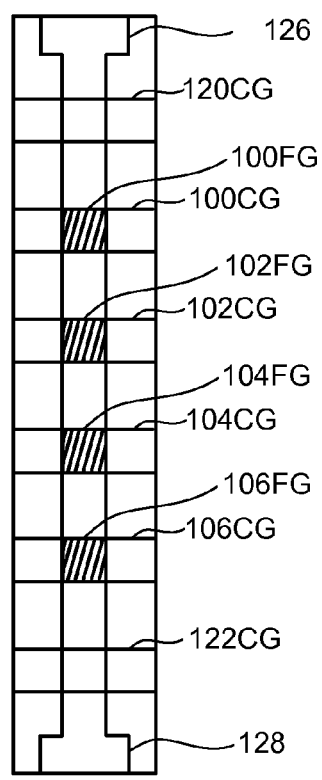
FIG. 1a is a top view of a NAND string.
Figure 1B:
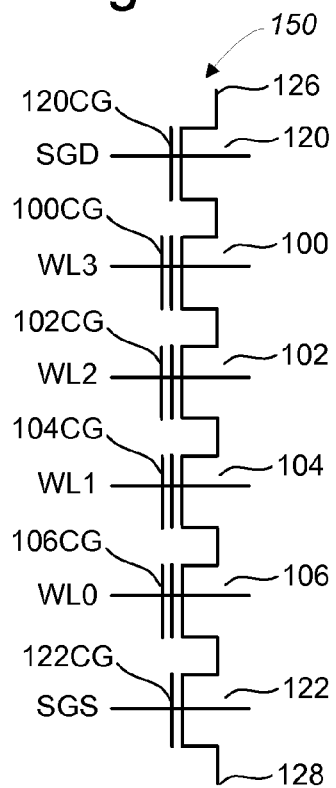

FIG. 1a is a top view showing one NAND string. FIG. 1b is an equivalent circuit diagram of the NAND string of FIG. 1a. The NAND string depicted in FIGS. 1a and 1b includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 1C:
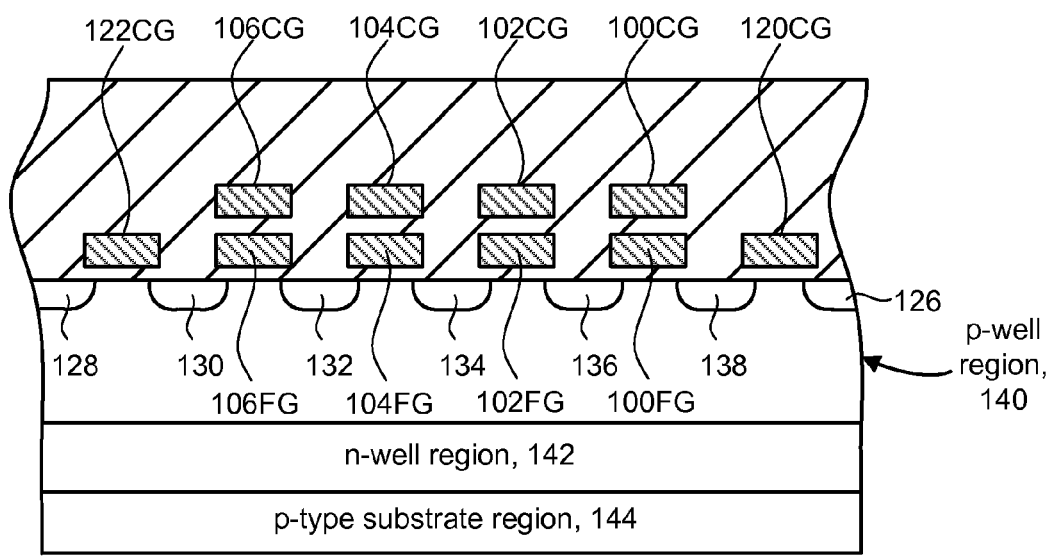

FIG. 1c is a cross-sectional view of the NAND string of FIG. 1a. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a-1c show four memory cells in the NAND string, the use of four transistors is provided only as an example. A NAND string used with the technology described herein can have less than four memory cells or more than four memory cells. For example, some NAND strings will include up to 64 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present invention.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 2:
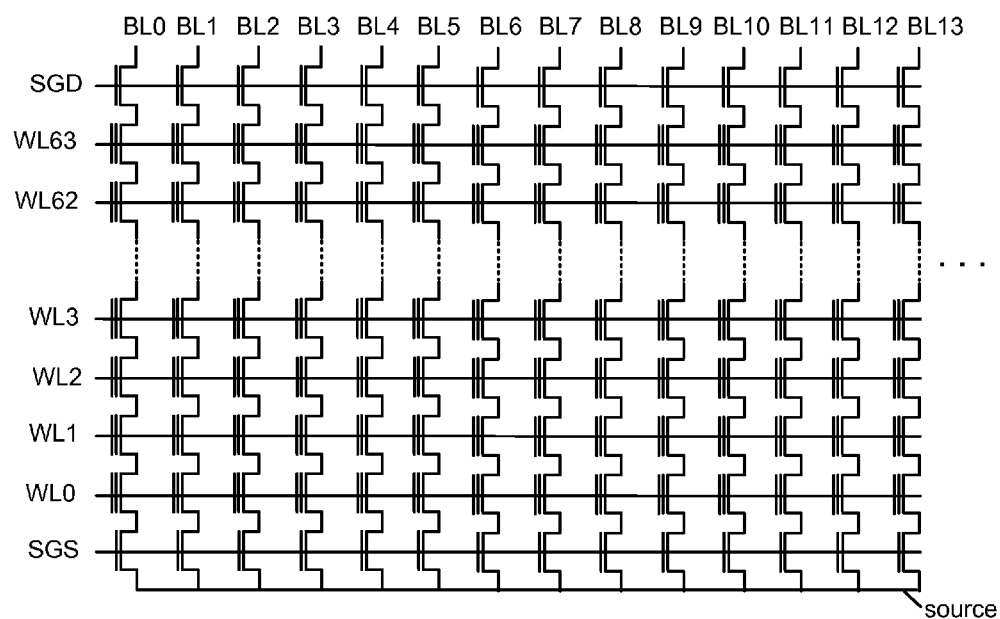
FIG. 2 depicts a block of NAND flash memory cells, where the block is made up of NAND strings such as depicted in FIGS. 1a-1c.

FIG. 2 depicts a block of NAND flash memory cells, where the block is made up of NAND strings such as depicted in FIGS. 1a-1c. The block includes a number of NAND strings and respective bit lines, e.g., BL0, BL1, . . . . Each NAND string is connected at one end to a drain select gate (SGD), and the control gates of the drain select gates are connected via a common SGD line. The NAND strings are connected at their other end to a source select gate which, in turn, is connected to a common source line. A number of word lines, including optional dummy word lines, extend between the source select gates and the drain select gates. In an example block, there are 8,512 columns corresponding to bit lines BL0, BL1, . . . BL8511.

Figure 3:
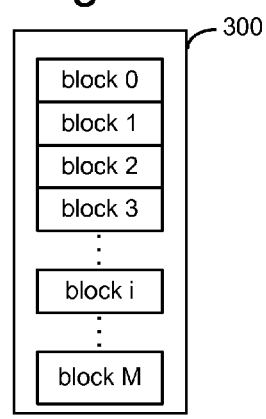
FIG. 3 depicts a memory array comprising multiple blocks, such as the block of FIG. 2.

FIG. 3 depicts a memory array 300 comprising multiple blocks, such as the block of FIG. 2. As one example, a NAND flash EEPROM is described that is partitioned into M=1,024 blocks. The data stored in each block can be simultaneously erased. In one embodiment, the block is the minimum unit of storage elements that are simultaneously erased. Storage elements can be erased by raising the p-well to an erase voltage (e.g., 14-22 V) and grounding the word lines of a selected block while floating the source and bit lines. Erasing can be performed on the entire memory array, separate blocks, or another unit of the storage elements which is a portion of the memory device. During erasing, electrons are transferred from the floating gates of the storage elements to the p-well region so that the Vth of the storage elements becomes negative. A strong electric field is applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered.

Figure 4:
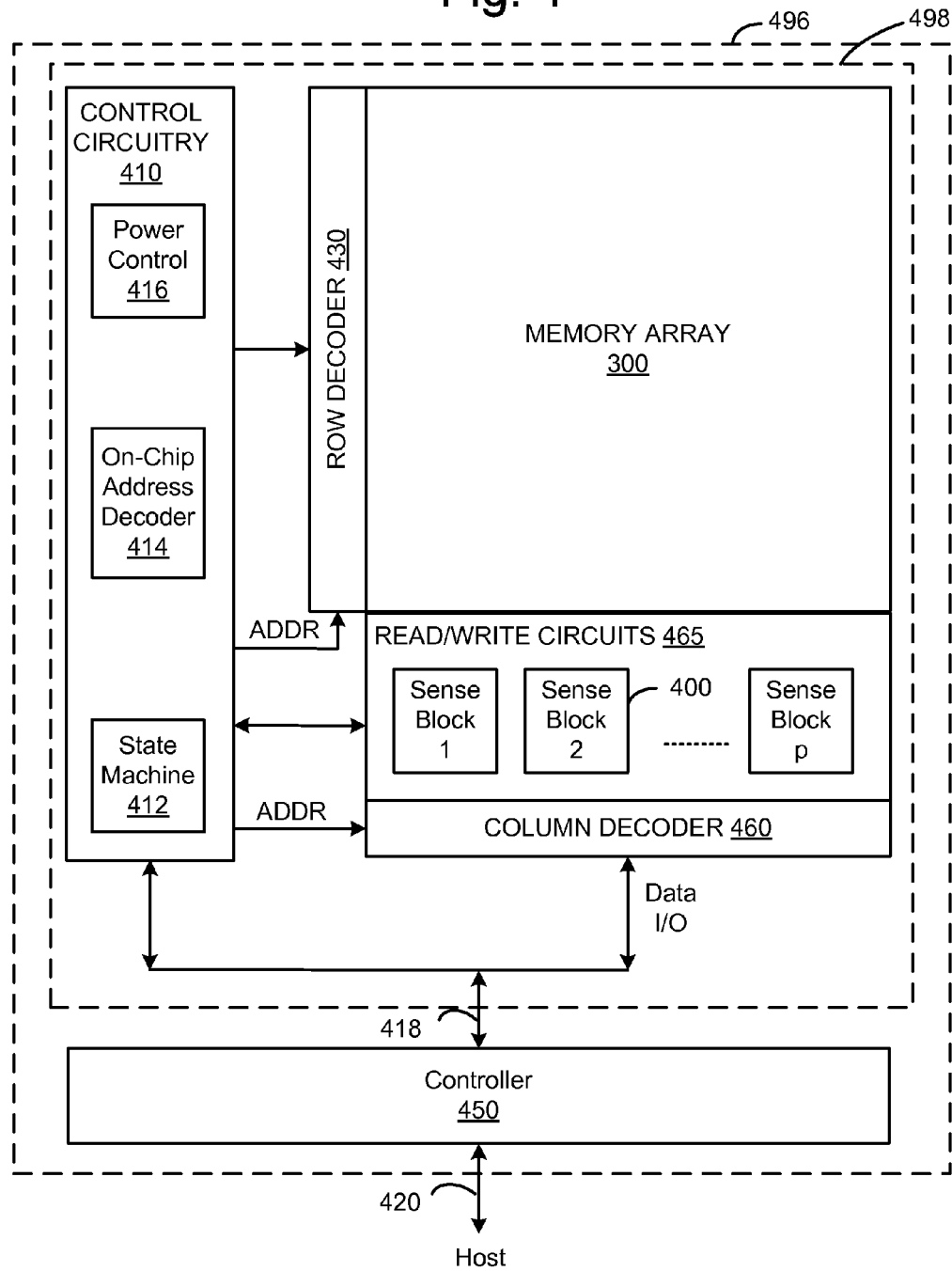
FIG. 4 is a block diagram of a non-volatile memory system which includes the memory array of FIG. 3, and uses single row/column decoders and read/write circuits.

FIG. 4 is a block diagram of a non-volatile memory system using single row/column decoders and read/write circuits. The diagram illustrates a memory device 496 having read/write circuits for reading and programming a page of storage elements in parallel, according to one embodiment. Memory device 496 may include one or more memory die 498. Memory die 498 includes a two-dimensional array of storage elements 300, such as depicted in FIG. 3, control circuitry 410, and read/write circuits 465. In some embodiments, the array of storage elements can be three dimensional. The memory array 300 is addressable by word lines via a row decoder 430 and by bit lines via a column decoder 460. The read/write circuits 465 include multiple sense blocks 400 and allow a page of storage elements to be read or programmed in parallel. Typically a controller 450 is included in the same memory device 496 (e.g., a removable storage card) as the one or more memory die 498. Commands and Data are transferred between the host and controller 450 via lines 420 and between the controller and the one or more memory die 498 via lines 418.

The control circuitry 410 cooperates with the read/write circuits 465 to perform memory operations on the memory array 300. The control circuitry 410 includes a state machine 412, an on-chip address decoder 414, and a power control module 416. The state machine 412 provides chip-level control of memory operations. The on-chip address decoder 414 provides an address interface between that used by the host or a memory controller to the hardware address used by the decoders 430 and 460. The power control module 416 controls the power and voltages supplied to the word lines and bit lines during memory operations.

In some implementations, some of the components of FIG. 4 can be combined. In various designs, one or more of the components (alone or in combination), other than storage element array 300, can be thought of as a managing or control circuit. For example, one or more managing or control circuits may include any one of or a combination of control circuitry 410, state machine 412, decoders 414/460, power control 416, sense blocks 400, read/write circuits 465, controller 450, etc. The one or more managing or control circuits can provide erase operations as discussed herein.

In another embodiment, a non-volatile memory system uses dual row/column decoders and read/write circuits. Access to the memory array 300 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 300. In this way, the density of the read/write modules is essentially reduced by one half.

Figure 5:
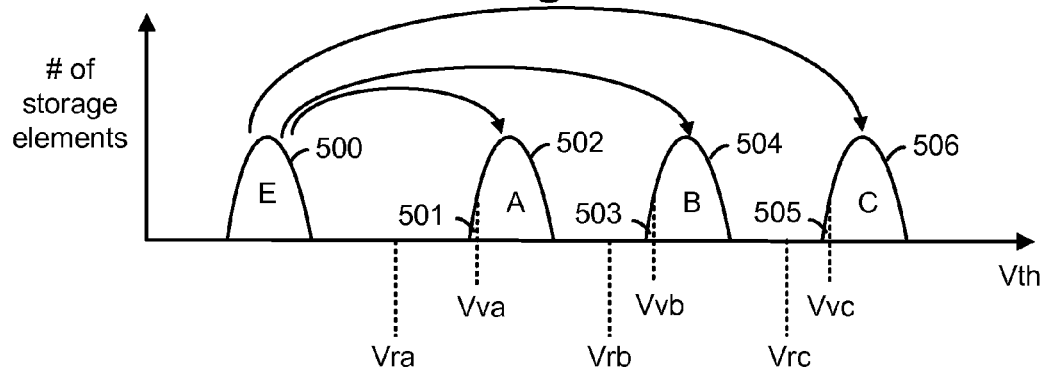
FIG. 5 depicts an example set of threshold voltage distributions and one-pass programming.

FIG. 5 depicts an example set of threshold voltage distributions and one-pass programming. Example threshold voltage distributions for the storage element array are provided for a case where each storage element stores two bits of data. A first threshold voltage distribution 500 is provided for erased (E state) storage elements. Three threshold voltage distributions 502, 504 and 506 represent programmed states A, B and C, respectively. In one embodiment, the threshold voltages in the E distribution are negative and the threshold voltages in the A, B and C distributions are positive.

The number of storage elements which are in a particular state can be determined by maintaining a count of storage elements whose threshold voltage is determined to exceed the corresponding verify level.

Each distinct threshold voltage range corresponds to predetermined values for the set of data bits. The specific relationship between the data programmed into the storage element and the threshold voltage levels of the storage element depends upon the data encoding scheme adopted for the storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the other multi-state structures including those that include more or less than four states can also be used.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc. Generally, a verify operation can be considered to pass for a given target data state (e.g., A, B or C) even when a small number of storage elements have not reached the target data state. These are referred to as bit ignore storage elements, and are represented by regions 501, 503 and 505 of distributions 502, 504 and 506, respectively. The control can determine whether the number of bit ignore storage elements for a data state is less than a specified level and declare a verify pass. Or, the control can determine whether the number of bit ignore storage elements for a data state is more than another specified level and declare a verify pass. Also, a verify level which is not associated with a particular data state can be used to trigger specific control actions. For example, different programming modes can be set based on whether the Vth of a specified number of storage element have or have not exceeded the verify level.

Figure 9A:
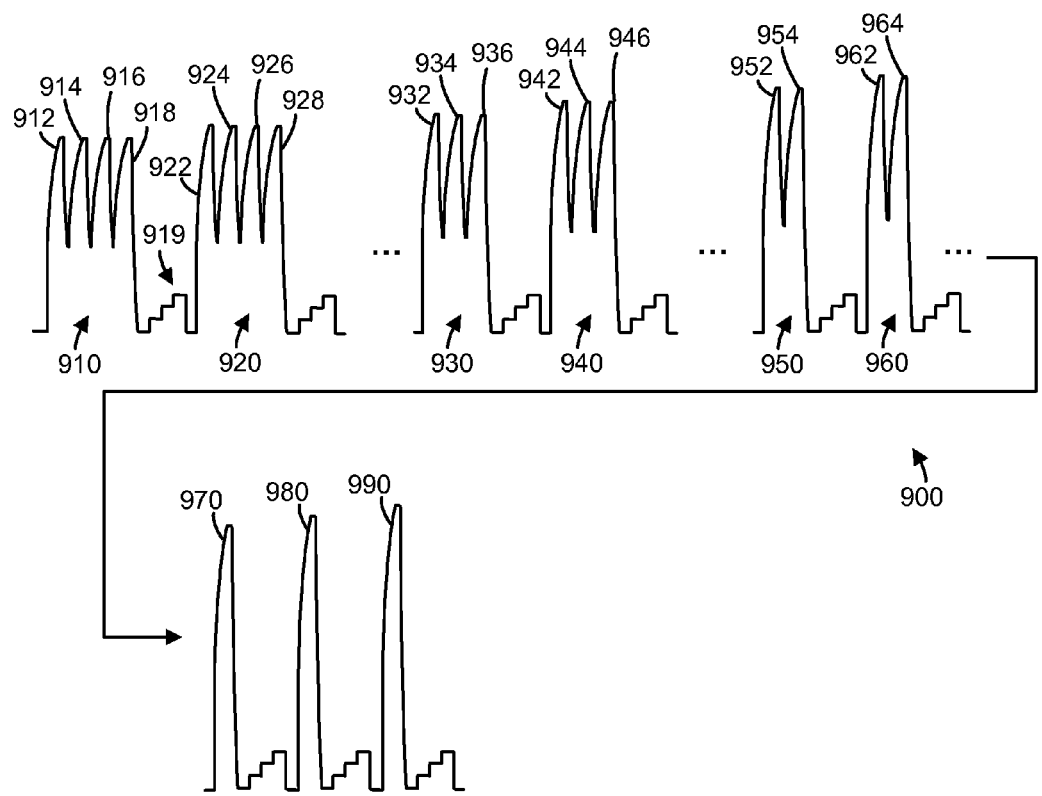
FIG. 9a depicts an example programming waveform, including sets of sub-pulses, applied to a selected word line in a program operation, to achieve reduced program noise as depicted in FIG. 8.

In one embodiment, known as full sequence programming, storage elements can be programmed from the erase state E directly to any of the programmed states A, B or C. For example, a population of storage elements to be programmed may first be erased so that all storage elements in the population are in erased state E. A series of program pulses such as depicted in FIG. 9a will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Moreover, all bit line programming or odd-even programming can be used. With all bit line programming, all storage elements of a selected word line, e.g., all bit lines, are programming at the same time using the same pulse train of program pulses. With odd-even programming, the storage elements of a selected word line associated with odd-numbered bit lines are programmed separately from the storage elements of a selected word line associated with even-numbered bit lines.

Figure 6:
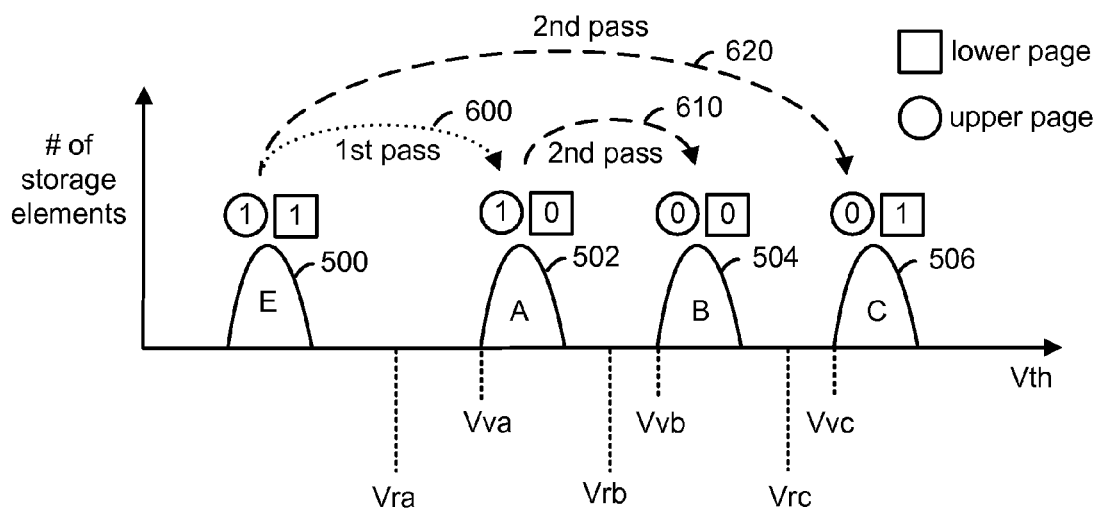
FIG. 6 depicts an example set of threshold voltage distributions and two-pass programming.

FIG. 6 illustrates an example of a two-pass technique of programming a multi-state storage element that stores data for two different pages: a lower page and an upper page. Four states are depicted by repeating the threshold voltage distributions 500, 502, 504 and 506 from FIG. 5. These states, and the bits they represent, are: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 900. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 620. If the storage element had been programmed into state A as a result of the first programming pass, then the storage element is further programmed in the second pass so that the threshold voltage is increased to be within state B, as depicted by arrow 610. The result of the second pass is to program the storage element into the state designated to store a logic "0" for the upper page without changing the data for the lower page. In both FIG. 5 and FIG. 6, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. In FIG. 6, the bit ignore storage elements are not depicted.

Figure 7A:
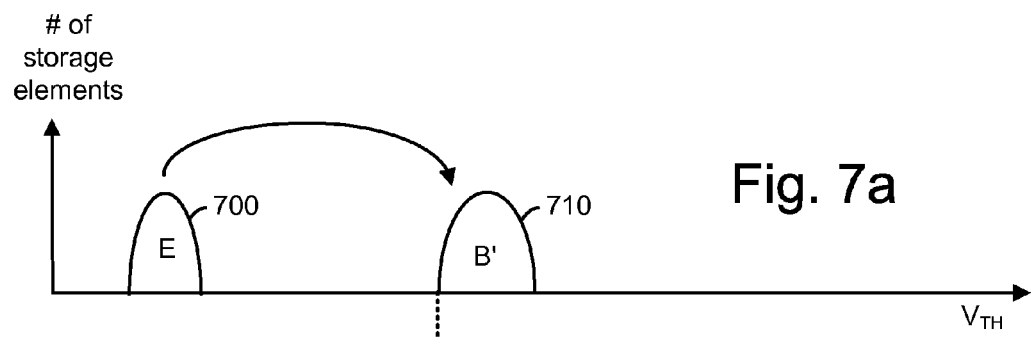
FIGS. 7a-c show various threshold voltage distributions and describe a process for programming non-volatile memory.
Figure 7B:
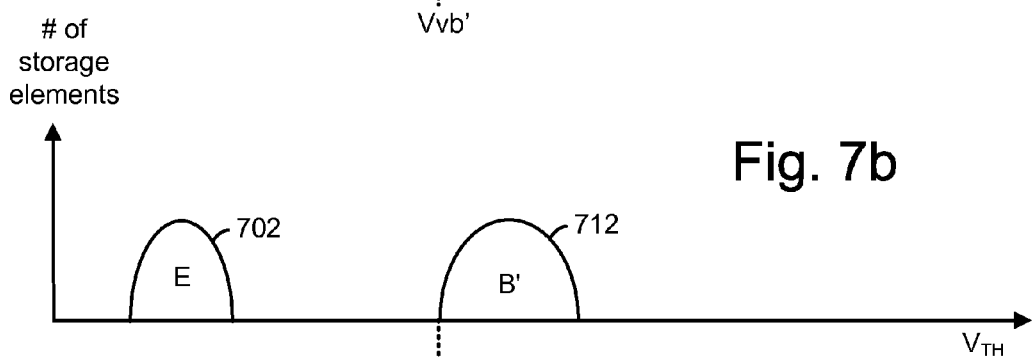
Figure 7C:
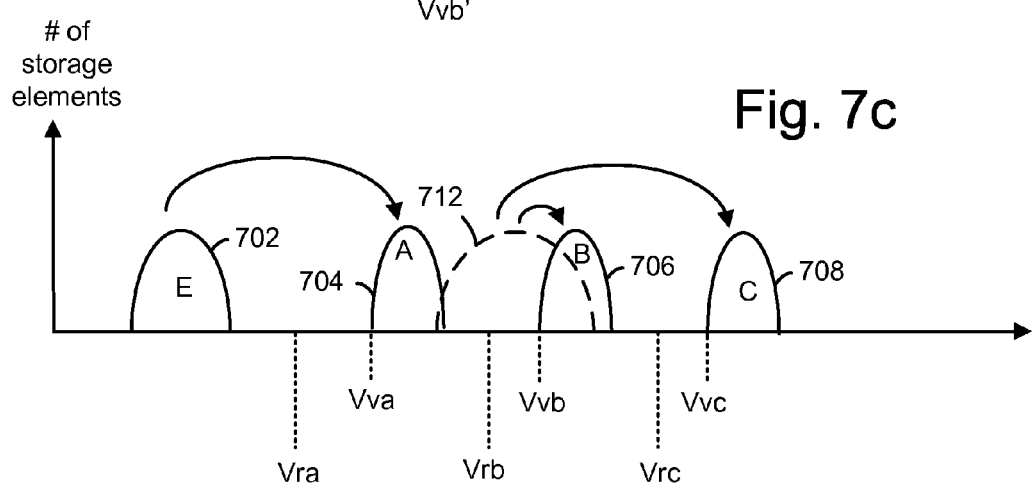

FIGS. 7a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E (distribution 700). If the data is to be programmed to 0, then the threshold of voltage of the storage element is raised such that the storage element is programmed to state B' (distribution 710). FIG. 7a therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. This will have the effect of widening the threshold voltage distribution for state B' to that depicted as threshold voltage distribution 712 of FIG. 7b. This apparent widening of the threshold voltage distribution will be remedied when programming the upper page. The E state will also be widened as depicted by distribution 702.

FIG. 7c depicts the process of programming the upper page. If the storage element is in erased state E and the upper page is to remain at 1, then the storage element will remain in state E (distribution 702). If the storage element is in state E and its upper page data is to be programmed to 0, then the threshold voltage of the storage element will be raised so that the storage element is in state A (distribution 704). If the storage element was in intermediate threshold voltage distribution 712 and the upper page data is to remain at 1, then the storage element will be programmed to final state B (distribution 706). If the storage element is in intermediate threshold voltage distribution 712 and the upper page data is to become data 0, then the threshold voltage of the storage element will be raised so that the storage element is in state C (distribution 708). The process depicted by FIGS. 7a-c reduces the effect of floating gate to floating gate coupling because only the upper page programming of neighbor storage elements will have an effect on the apparent threshold voltage of a given storage element. An example of an alternate state coding is to move from distribution 712 to state C when the upper page data is a 1, and to move to state B when the upper page data is a 0.

Although FIGS. 7a-c provide an example with respect to four data states and two pages of data, the concepts taught can be applied to other implementations with more or fewer than four states and more or less than two pages. For example, memory devices with eight or sixteen states per storage element are currently planned or in production.

In FIGS. 7a-7c, the bit ignore storage elements are not depicted.

Figure 8:
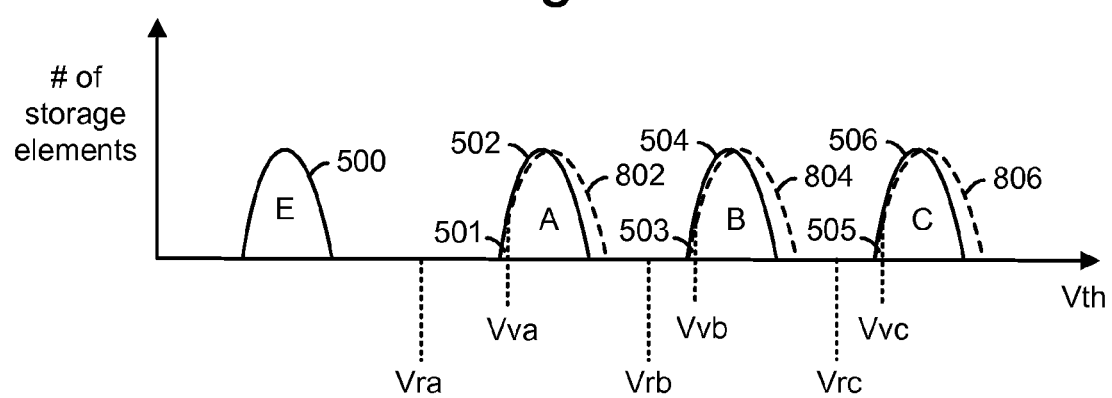
FIG. 8 depicts the example set of threshold voltage distributions of FIG. 5, in addition to widened threshold voltage distributions which are caused by program noise.

FIG. 8 depicts the example set of threshold voltage distributions of FIG. 5, in addition to widened threshold voltage distributions which are caused by program noise. The like-numbered components are the same as in FIG. 5. Also depicted are widened distributions 802, 804 and 806 for states A, B and C, respectively, which are caused by program noise.

Generally, as NAND flash memory continues to scale down, program noise gradually becomes more difficult to control. One major cause of program noise is the reduction of the floating-gate to control-gate capacitance, which determines the Vth shift per electron. When the capacitance becomes smaller, the average number of electrons injected to the floating gate during each program pulse will decrease (for the same Vth increase). As a result, the ΔVth variation, e.g., program noise, will become larger during programming. The larger program noise will cause wider Vth distribution widths, as depicted by the widened Vth distributions 802, 804 and 806. This can severely limit Vth margins between the data states of multi-level storage elements. A multi-pulse programming technique detailed below can significantly reduce program noise, especially for smaller scale memory devices.

FIG. 9a depicts an example programming waveform, including sets of sub-pulses, applied to a selected word line in a program operation, to achieve reduced program noise as depicted in FIG. 8. With the multi-pulse programming technique, at each program voltage (Vpgm) level, instead of using one program pulse, sets of multiple program pulses or sub-pulses are applied repeatedly. Generally, the use of more sub-pulses per set can result in a greater reduction in program noise and as a result, a tightening of Vth distributions. However, the benefit may saturate when more than a certain number of sub-pulses are used per set. In some implementations, the benefit will saturate when more than about five sub-pulses are used per set.

For example, a programming waveform 900 may be applied to selected non-volatile storage elements, such as storage elements associated with a common word line, in a set of storage elements, such as a memory array or block. The programming waveform 900 includes successive sets 910, 920, 930, 940, 950 and 960, where each set is a set of two or more adjacent sub-pulses. For example, sets 910 and 920 each include four sub-pulses, sets 930 and 940 each include three sub-pulses and sets 950 and 960 each include two sub-pulses. Specifically, set 910 includes sub-pulses 912, 914, 916 and 918, and set 920 includes sub-pulses 922, 924, 926 and 928. Set 930 includes sub-pulses 932, 934 and 936, and set 940 includes sub-pulses 942, 944 and 946. Set 950 includes sub-pulses 952 and 954, and set 960 includes sub-pulses 962 and 964. Each set includes an initial sub-pulse, a final sub-pulse and optionally one or more intermediate sub-pulses between the initial and final sub-pulses.

Thus, at least one of the sets of program sub-pulses comprises an integer number N>1 of sub-pulses, and subsequently at least one other of the sets of program sub-pulses comprises an integer number M of sub-pulses, where 1<M<N. For instance, when N=4, M=2 or 3, and when N=3, M=2. A number of sub-pulses in each set of program sub-pulses decreases incrementally over time in the programming operation.

Generally, one set of program sub-pulses can be any of the sets 910, 920, 930, 940, 950 and 960, and another set of program sub-pulses can be any other of the sets 910, 920, 930, 940, 950 and 960. In some embodiments, only one set of program sub-pulses is used.

Each of the sets can be followed by verify operations for one or more target data states, such as the A, B and C states in a four-state memory device. For instance, set 910 is followed by verify voltages 919. Following the at least one set of sub-pulses, one or more solitary pulses 970, 980 and 990 may be applied. A solitary pulse is a single program pulse which starts at an initial level, steps up to a peak level and steps down to the initial level again, without stopping at any intermediate level. The solitary program voltages can also be followed by verify voltages. In some cases, verify operations are performed for lower data states only (e.g., state A) for the earlier sets of sub-pulses, for lower and middle data states only (e.g., states A and B) for the middle sets of sub-pulses, and for middle and higher data states only (e.g., states B and C) for the higher sets of sub-pulses and for the solitary pulses. Note that in some cases the programming operation may be completed before the solitary pulses are applied.

An example implementation uses four or five sub-pulses in the first set. Within a set, there are no verify voltages. Thus, no verify operation is performed between the first and last sub-pulses of a set. To save programming time, the sub-pulses do not need to ramp down to the initial level such as 0 V. Instead, after a sub-pulse, the program voltage can be discharged or stepped down to an intermediate level, and from that be ramped up or stepped up again immediately. Each set of sub-pulses will become saw-shaped after using this scheme, where each sub-pulse appears as a tooth of a saw.

The programming voltage 900 can be optimally tailored to allow sufficient channel boosting while minimizing program disturb, by incrementally decreasing the number of sub-pulses in a set over time as the programming operation proceeds. The incremental decrease can be monotonically decreasing so that a decrease is provided after multiple sets in which no decrease is provided. Specifically, when a program pulse is relatively longer in duration, channel boosting will become weaker, and as a result, program disturb caused by insufficient boosting becomes relatively more likely to occur. However, when the program voltage amplitude is relatively low, program disturb will not be a threat. Thus, even though the use of multiple sub-pulses per set may impair boosting to some extent, this is acceptable for lower amplitude pulses earlier in the program operation, before the program voltages reach the higher amplitudes.

One option is to transition to a set with fewer sub-pulses when a specified number of the sets of program sub-pulses have been applied in the programming operation. For example, it may be decided to transition from four sub-pulses per set to three sub-pulses per set at the fourth set, and transition from three sub-pulses per set to two sub-pulses per set at the eighth set. Further, a transition to solitary pulses can occur when a specified number of the sets of program sub-pulses have been applied in the programming operation. Each transition can be to a set with one fewer sub-pulse, for instance.

Specifically, one example implementation for transitioning during a programming operation to a set with fewer sub-pulses uses a fixed program set (pulse) number. For a four-state embodiment (states E, A, B and C), assume a step size or $\Delta Vpgm=0.3$ V. This is the step up increment between successive sets of sub-pulses. Each set can step up from the prior set, for instance. Thus, an amplitude of sub-pulses in each set of program sub-pulses increases incrementally over time in the programming operation. Assume also that about 20 to 24 sets of sub-pulses are needed to finish the programming of all four states during the upper page program. In this case, a transition from more sub-pulses to fewer sub-pulses can be devised as follows. Start programming with sets of four sub-pulses. At the eighth set, switch to sets of three sub-pulses. At the fourteenth set, switch to sets of two sub-pulses. At the twentieth set, switch to solitary pulses.

The transitions at the eighth and the fourteenth sets can be considered to be transitions from at least one set of program sub-pulses to at least one other set of program sub-pulses when a specified number of the sets of program sub-pulses have been applied in the programming operation. The transition at the twentieth set can be considered to be a transition from at least one set of program sub-pulses to at least one solitary pulse.

Another option is to provide an adaptive transition to a set with fewer sub-pulses, or to a solitary pulse. For example, an adaptive transition may be based on an extent to which programming to a target data state has been completed. As the program operation progresses, many storage elements or bits will pass verify and become locked out or inhibited from further programming, typically by raising the associated bit line voltage. Based on a number of storage elements which pass verify, a transition to a smaller number of sub-pulses or to a solitary pulse can be triggered. Alternatively, the transition can be triggered when the number of storage elements which have not passed verify is smaller than a bit ignore level or other specified level.

Specifically, one example implementation for transitioning during a programming operation to a set with fewer sub-pulses uses an adaptive transition in combination with a fixed program set (pulse) number transition. Again, for a four-state embodiment (states E, A, B and C), assume a step size or $\Delta Vpgm=0.3$ V. In this case, a transition from more sub-pulses to fewer sub-pulses can be devised as follows. Start programming with sets of four sub-pulses. At the eighth set, switch to sets of three sub-pulses. After all A-state storage elements (e.g., all except the A-state bit ignore storage elements), or some other specified portion of the A-state storage elements, pass verify at Vva, switch to sets of two sub-pulses. After all B-state storage elements (e.g., all except the B-state bit ignore storage elements), or some other specified portion of the B-state storage elements, pass verify at Vvb, switch to solitary pulses.

The transition when all A-state storage elements have passed a respective verify level can be considered to be a transition from at least one set of program sub-pulses to at least one other set of program sub-pulses based on an extent to which programming to a target data state (A-state) has been completed. The transition when all B-state storage elements have passed a respective verify level can be considered to be a transition from at least one set of program sub-pulses to at least one solitary program pulse based on an extent to which programming to a target data state (B-state) has been completed.

Triggering a transition to a set with fewer sub-pulses, or to a solitary pulse, by tracking storage elements, is an adaptive approach which accounts for various performance changes which can occur over time in a memory device. For example, as a memory device accumulates more program-erase cycles, the storage elements may program faster, e.g., with fewer program pulses, so that the transition occurs sooner. Moreover, different memory devices, or different blocks of storage elements in a memory array, or even different word lines, can program at different speeds. An adaptive transition automatically accounts for such variations.

Generally, the target data states for the storage elements in communication with a selected word line will be uniformly distributed. For example, with four data states, about one-fourth of the storage elements will remain in the E state, about one-fourth will be programmed to the A state, about one-fourth will be programmed to the B state, and about one-fourth will be programmed to the C state. Thus, if state B is the trigger state, and Vvb is the corresponding target verify level, the number of storage elements which are expected to reach the B state is known. A transition can be made based on any desired portion of the trigger state storage elements. Moreover, to trigger a transition sooner in the program operation, a smaller portion of the trigger state storage elements can be used. Similarly, to trigger a transition later in the program operation, a larger portion of the trigger state storage elements can be used. Also, it is also possible to use a trigger verify level which is not associated with a data state as a trigger to a transition to a set with fewer sub-pulses or to a solitary pulse. This can provide additional flexibility in determining when a transition starts.

Moreover, in transitioning from N sub-pulses to N−1 or fewer sub-pulses per set, the original steady state will be broken. During the transition, the Vth change ($\Delta$Vth) will be a little smaller than the step increase from one set to the next ($\Delta$Vpgm). This smaller $\Delta$Vth tends to ensure that no over-programming will occur during the transition period. Generally, the amplitude of sub-pulses in each set can increase incrementally in the sets over time as the programming operation proceeds. A fixed or varying step size can be used.

From the point of the transition, a smaller number of sub-pulses per set can be gradually implemented. Moreover, at an end stage of the program operation, a transition to solitary pulses can be made. At that stage, only some small number of bits at the highest states still have not been locked out. Even though the program noise is higher by using solitary pulse programming, at this time it may mostly only make the highest state a little wider. Also, when a high Vpgm is reached, a shorter program duration is preferred for stronger boosting, and therefore using solitary pulses at the end of program can help reduce the risk of program disturb.

Overall, the use of multi-pulse programming can reduce program noise without excessively increasing program time. Further, the storage elements will not become more vulnerable to insufficient boosting disturb.

Figure 9B:
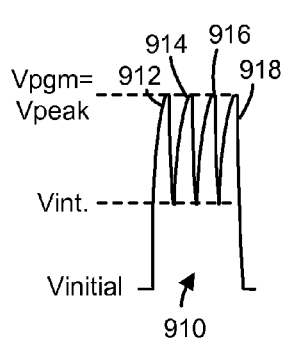
FIG. 9b depicts the set 910 of sub-pulses of FIG. 9a in further detail.

FIG. 9b depicts the set 910 of sub-pulses of FIG. 9a in further detail. The set 910 includes an initial sub-pulse 912 which transitions from a common starting or initial level (e.g., 0 V) to a respective peak level (e.g., Vpgm=Vpeak) and then to a respective intermediate level (e.g., Vint.) between the initial level and the respective peak level, without returning to the initial level. The set also includes a final sub-pulse 918 which transitions from a respective intermediate level to a respective peak level and then to the common starting level. In one approach, the respective intermediate levels of the initial and final sub-pulses are the same. The set further includes at least one additional sub-pulses between the initial sub-pulse 912 and the final sub-pulse 918. The additional sub-pulse transitions from a respective intermediate level (Vint) to a respective peak level (Vpeak) and then back to the respective intermediate level (Vint) of the additional sub-pulse.

Figure 9C:
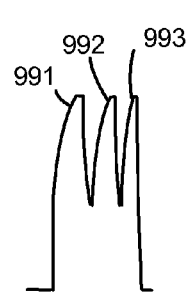

FIG. 9c depicts an alternative set of sub-pulses, as an alternative to the sets of sub-pulses of FIG. 9a. An aspect of the example programming waveform 900 of FIG. 9a is that the peak and intermediate amplitudes of each sub-pulse in a set are the same. Further, the duration of each sub-pulse is the same. In another option, the duration of the sub-pulses in a set can vary. For example, in FIG. 9c, sub-pulse 991 can have the longest duration, while sub-pulse 922 has the next longest duration and sub-pulse 993 has the shortest duration.

Figure 9D:
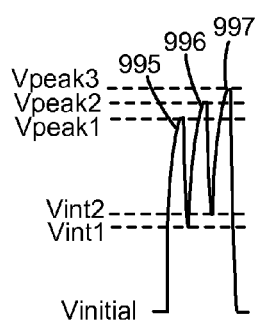

FIG. 9d depicts another alternative set of sub-pulses, as an alternative to the sets of sub-pulses of FIG. 9a. Here, the peak and intermediate amplitudes of each sub-pulse in a set differ. For example, sub-pulse 995 can have the lowest amplitude (Vpeak1), while sub-pulse 996 has a higher amplitude (Vpeak2) and sub-pulse 997 has the highest amplitude (Vpeak3). Furthermore, sub-pulse 995 steps up from Vinitial to Vpeak1 and then down to Vint1, a respective intermediate level. Sub-pulse 996 steps up from Vint1, a respective intermediate level, to Vpeak2 and then down to Vint2, another respective intermediate level. Sub-pulse 997 steps up from Vint2, a respective intermediate level, to Vpeak3 and then down to Vinitial. Other variations are possible such as a case where Vint1=Vint2.

Figure 10:
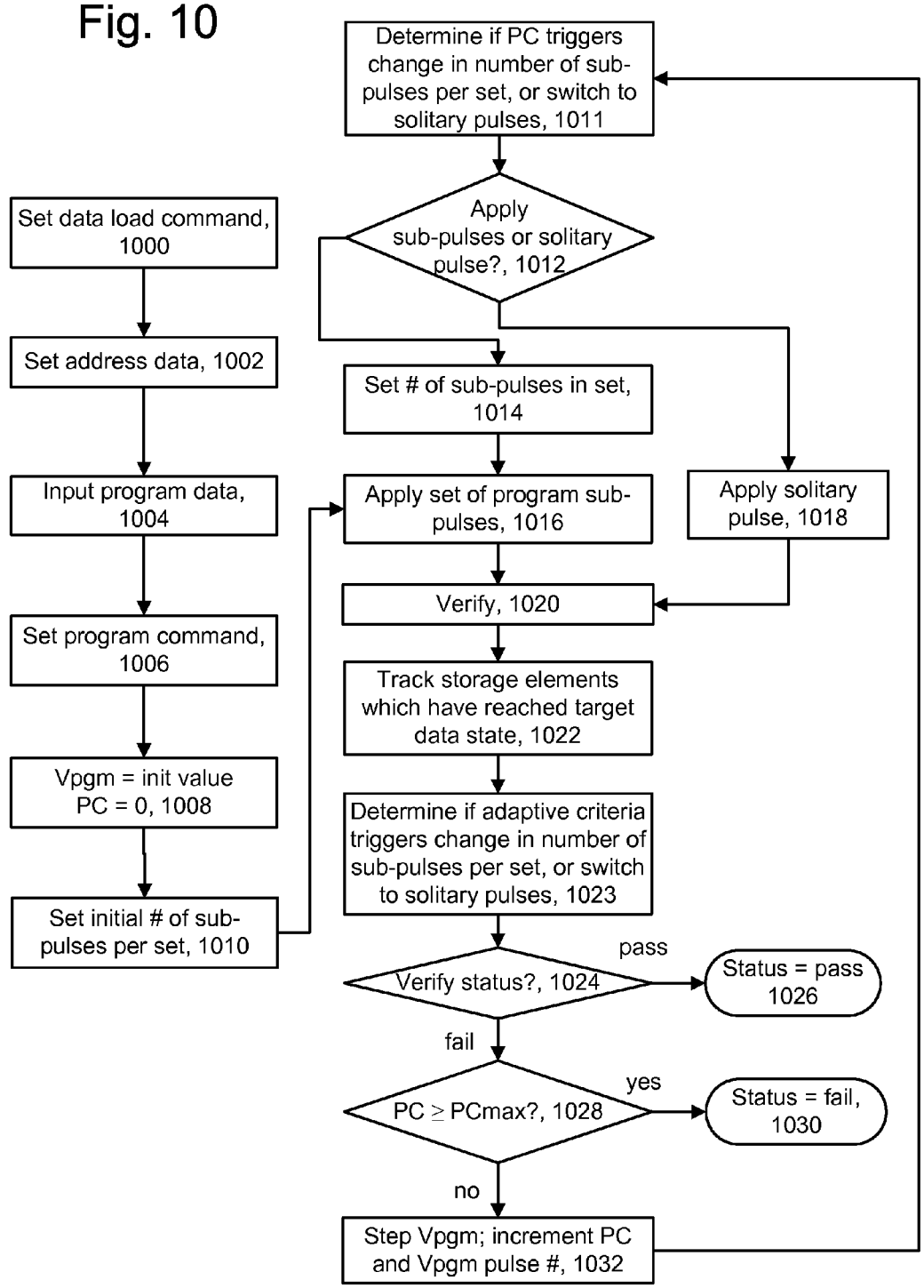

FIG. 10 is a flow chart describing one embodiment of a method for programming non-volatile memory using sets of sub-pulses such as provided in FIG. 9a. In step 1000, a "data load" command is issued by the controller and input received by control circuitry 410 (FIG. 4). In step 1002, address data designating the page address is input to decoder 414 from the controller or host. In step 1004, a page of program data for the addressed page is input to a data buffer for programming. That data is latched in the appropriate set of latches. In step 1006, a "program" command is issued by the controller to state machine 412.

Triggered by the "program" command, the data latched in step 1004 will be programmed into the selected storage elements controlled by state machine 412 using the stepped sets of program pulses of the programming waveform 900 of FIG. 9a, for instance, applied to the appropriate selected word line. In step 1008, the program voltage, Vpgm, is initialized to an initial value (e.g., 12 V or other value) and a program counter (PC) maintained by state machine 412 is initialized at zero. PC is the total number of sets of sub-pulses and solitary pulses which have been applied. In step 1010, an initial number of sub-pulses per set is set. In the example of FIG. 9a, this is four sub-pulses per set. Step 1016 applies a set of program sub-pulses to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to 1.5-3 V to inhibit programming.

In step 1020, the states of the selected storage elements are verified in a verify operation. If it is detected that the target threshold voltage of a selected storage element has reached the appropriate verify level, then the data stored in the corresponding data latch is changed to a logic "1." If it is detected that the threshold voltage has not reached the appropriate verify level, the data stored in the corresponding data latch is not changed. In this manner, a bit line having a logic "1" stored in its corresponding data latch does not need to be programmed. When all of the data latches are storing logic "1," the state machine knows that all selected storage elements have been programmed. Step 1022 tracks the storage elements which have reached a target data state. As mentioned, this can occur for one or more trigger data states which are used to trigger a transition to a set with fewer sub-pulses and/or a transition to solitary pulses. For example, step 1022 may update a count based on the number of additional storage elements which were verified to reach a trigger verify level, or which were not verified to reach a trigger verify level. In this way, an extent to which programming to a target data state has been completed is determined. Step 1023 determines if an adaptive criteria has been met which triggers a change in the number of sub-pulses per set, or a switch to solitary pulses, based on step 1022, such as discussed in connection with FIG. 9a. This could include, e.g., a number of A-state or B-state storage elements passing a verify level, in a four-state implementation.

In step 1024, a check is made as to whether all of the data latches are storing logic "1." If all of the data latches are storing logic "1," the verify operation has passed, and the programming process is complete and successful because all selected storage elements were programmed and verified. A status of "PASS" is reported in step 1026. In some embodiments, the programming process is considered complete and successful even if not all selected storage elements were verified as being programmed, as mentioned in connection with the bit ignore regions in FIG. 5. In such a case, errors during subsequent read operations can occur due to insufficiently programmed storage elements. However, these errors can be corrected by ECC.

If, in step 1024, it is determined that not all of the data latches are storing logic "1," then the programming process continues. In some embodiments, the program process stops even if not all of the data latches are storing logic "1." In decision step 1028, the program counter PC is checked against a program limit value PCmax. One example of a program limit value is twenty; however, other numbers can also be used. If the program counter PC is greater than or equal to PCmax, then the program operation has failed, and a status of "FAIL" is reported in step 1030. If the program counter PC is less than PCmax, then step 1032 is performed, in which the program counter PC is incremented by one, and Vpgm is incremented by a step size ΔVpgm. The process continues at step 1011, which determines if PC triggers a change in the number of sub-pulses per set or a switch to solitary pulses. Note that steps 1011 and 1022/1023 may be used in combination so that both fixed and adaptive criteria are used, or only fixed criteria may be used, or only adaptive criteria may be used, in determining when to switch to fewer sub-pulses per set and/or when to switch to a solitary pulse.

Decision step 1012 determines whether to apply a set of sub-pulses or to apply a solitary program pulse. This step can be responsive to steps 1011 and/or 1022/1023, for instance.

If decision step 1012 determines that another set of sub-pulses is to be applied, step 1014 sets the number of sub-pulses in the set. For example, the number of sub-pulses in a set can be kept constant from the last loop, or changed. Step 1016 applies the next set of sub-pulses. If decision step 1012 determines that a solitary pulse is to be applied, step 1018 applies a solitary pulse to the selected word line. In either case, a verify operation is performed again at step 1020.

Accordingly, in one embodiment, a method for programming in a non-volatile storage system is provided. The method includes, in connection with a programming operation involving selected non-volatile storage elements in a set of non-volatile storage elements, applying a plurality of sets of program sub-pulses to the selected non-volatile storage elements. The set of non-volatile storage elements is in communication with a set of word lines, and the plurality of sets of program sub-pulses are applied to the selected non-volatile storage elements via a selected word line of the set of word lines. Each set of program sub-pulses comprises an initial sub-pulse which transitions from a common starting level (0 V) to a respective peak level and then to a respective intermediate level between the initial level and the respective peak level, without returning to the initial level, and a final sub-pulse which transitions from a respective intermediate level to a respective peak level and then to the common starting level. The method further includes performing a verify operation during the programming operation for at least one of the selected non-volatile storage elements following at least one of the sets of program sub-pulses.

In another embodiment, a non-volatile storage system includes a set of non-volatile storage elements, and a set of word lines in communication with the set of non-volatile storage elements, including a selected word line in communication with selected non-volatile storage elements of the set of non-volatile storage elements. At least one control circuit is in communication with the set of word lines. The at least one control circuit, in connection with a programming operation involving the selected non-volatile storage elements: applies a plurality of sets of program sub-pulses to the selected non-volatile storage elements, via the selected word line, where each set of program sub-pulses comprises an initial sub-pulse which transitions from a common starting level (0 V) to a respective peak level and then to a respective intermediate level between the initial level and the respective peak level, without returning to the initial level, and a final sub-pulse which transitions from a respective intermediate level to a respective peak level and then to the common starting level. The at least one control circuit also performs a verify operation during the programming operation for at least one of the selected non-volatile storage elements following at least one of the sets of program sub-pulses.

In another embodiment, a method for programming in a non-volatile storage system includes applying one set of program sub-pulses to selected non-volatile storage elements in a set of non-volatile storage elements. The one set of program sub-pulses comprises multiple sub-pulses having a respective amplitude, including an initial sub-pulse which transitions from a common starting level (0 V) to a respective peak level and then to a respective intermediate level between the initial level and the respective peak level, without returning to the initial level, and a final sub-pulse which transitions from a respective intermediate level to a respective peak level and then to the common starting level. Subsequently, the method includes applying another set of program sub-pulses to the selected non-volatile storage elements. The another set of program sub-pulses comprises multiple sub-pulses having a respective amplitude, but fewer sub-pulses than the one set of program sub-pulses. The multiple sub-pulses of the another set of program sub-pulses include an initial sub-pulse which transitions from the common starting level (0 V) to a respective peak level and then to a respective intermediate level between the initial level and the respective peak level, without returning to the initial level, and a final sub-pulse which transitions from a respective intermediate level to a respective peak level and then to the common starting level. The method further includes performing a verify operation during the programming operation for at least one of the selected non-volatile storage elements between the one set of program sub-pulses and the another set of program sub-pulses.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for programming in a non-volatile storage system, comprising:
   in connection with a programming operation involving selected non-volatile storage elements in a set of non-volatile storage elements, applying a plurality of sets of program sub-pulses to the selected non-volatile storage elements, the set of non-volatile storage elements is in communication with a set of word lines, and the plurality of sets of program sub-pulses are applied to the selected non-volatile storage elements via a selected word line of the set of word lines, each set of program sub-pulses comprises an initial sub-pulse which transitions from a common starting level to a respective peak level and then to a respective intermediate level between the common starting level and the respective peak level, without returning to the common starting level, and a final sub-pulse which transitions from a respective intermediate level to a respective peak level and then to the common starting level; and
   performing a verify operation during the programming operation for at least one of the selected non-volatile storage elements following at least one of the sets of program sub-pulses.

2. The method of claim 1, wherein:
   no verify operation is performed for the selected non-volatile storage elements between the initial sub-pulse and the final sub-pulse of each set of program sub-pulses.

3. The method of claim 1, wherein:
   at least one of the sets of program sub-pulses comprises an additional sub-pulse between the initial sub-pulse and the final sub-pulse, the additional sub-pulse transitions from a respective intermediate level to a respective peak level and then back to the respective intermediate level of the additional sub-pulse.

4. The method of claim 1, wherein:
   at least one of the sets of program sub-pulses comprises an integer number N>1 of sub-pulses, and subsequently at least one other of the sets of program sub-pulses comprises an integer number M of sub-pulses, where 1<M<N.

5. The method of claim 4, further comprising:
   transitioning from the at least one of the sets of program sub-pulses to the at least one other of the sets of program sub-pulses based on an extent to which programming to a target data state has been completed.

6. The method of claim 4, further comprising:
transitioning from the at least one of the sets of program sub-pulses to the at least one other of the sets of program sub-pulses when a specified number of the sets of program sub-pulses have been applied in the programming operation.

7. The method of claim 1, wherein:
a number of sub-pulses in each set of program sub-pulses decreases incrementally over time in the programming operation.

8. The method of claim 1, wherein:
an amplitude of sub-pulses in each set of program sub-pulses increases incrementally over time in the programming operation.

9. The method of claim 1, further comprising, in connection with the programming operation:
transitioning from the applying a plurality of sets of program sub-pulses to the selected non-volatile storage elements to applying at least one solitary pulse; and
performing a verify operation for the at least one of the selected non-volatile storage elements following the at least one solitary pulse.

10. The method of claim 9, wherein:
the transitioning occurs based on an extent to which programming to a target data state has been completed.

11. The method of claim 9, wherein:
the transitioning occurs based on a number of the sets of program sub-pulses which have been applied.

12. A non-volatile storage system, comprising:
a set of non-volatile storage elements;
a set of word lines in communication with the set of non-volatile storage elements, including a selected word line in communication with selected non-volatile storage elements of the set of non-volatile storage elements; and
at least one control circuit in communication with the set of word lines, the at least one control circuit, in connection with a programming operation involving the selected non-volatile storage elements: applies a plurality of sets of program sub-pulses to the selected non-volatile storage elements, via the selected word line, each set of program sub-pulses comprises an initial sub-pulse which transitions from a common starting level to a respective peak level and then to a respective intermediate level between the common starting level and the respective peak level, without returning to the common starting level, and a final sub-pulse which transitions from a respective intermediate level to a respective peak level and then to the common starting level, and performs a verify operation during the programming operation for at least one of the selected non-volatile storage elements following at least one of the sets of program sub-pulses.

13. The non-volatile storage system of claim 12, wherein:
no verify operation is performed for the selected non-volatile storage elements between the initial sub-pulse and the final sub-pulse of each set of program sub-pulses.

14. The non-volatile storage system of claim 12, wherein:
a number of sub-pulses in each set of program sub-pulses decreases incrementally over time in the programming operation.

15. The non-volatile storage system of claim 12, wherein:
an amplitude of sub-pulses in each set of program sub-pulses increases incrementally over time in the programming operation.

16. The non-volatile storage system of claim 12, wherein the one or more control circuits, in connection with the programming operation:
transition from the applying a plurality of sets of program sub-pulses to the selected non-volatile storage elements to applying at least one solitary pulse; and
perform a verify operation for the at least one of the selected non-volatile storage elements following the at least one solitary pulse.

17. A method for programming in a non-volatile storage system, comprising:
applying one set of program sub-pulses to selected non-volatile storage elements in a set of non-volatile storage elements, the one set of program sub-pulses comprises multiple sub-pulses having a respective amplitude, including an initial sub-pulse which transitions from a common starting level to a respective peak level and then to a respective intermediate level between the common starting level and the respective peak level, without returning to the common starting level, and a final sub-pulse which transitions from a respective intermediate level to a respective peak level and then to the common starting level;
subsequently, applying another set of program sub-pulses to the selected non-volatile storage elements, the another set of program sub-pulses comprises multiple sub-pulses having a respective amplitude, but fewer sub-pulses than the one set of program sub-pulses, the multiple sub-pulses of the another set of program sub-pulses include an initial sub-pulse which transitions from the common starting level to a respective peak level and then to a respective intermediate level between the common starting level and the respective peak level, without returning to the common starting level, and a final sub-pulse which transitions from a respective intermediate level to a respective peak level and then to the common starting level; and
performing a verify operation during the programming operation for at least one of the selected non-volatile storage elements between the one set of program sub-pulses and the another set of program sub-pulses.

18. The method of claim 17, wherein:
no verify operation is performed for the selected non-volatile storage elements between the initial sub-pulse and the final sub-pulse of the one set of program sub-pulses and the another set of program sub-pulses.

19. The method of claim 17, wherein:
the respective amplitude of the sub-pulses in the one set of program sub-pulses is less than the respective amplitude of the sub-pulses in the another set of program sub-pulses.

20. The method of claim 17, further comprising, in connection with the programming operation:
transitioning from the applying a plurality of sets of program sub-pulses to the selected non-volatile storage elements to applying at least one solitary pulse based on an extent to which programming to a target data state has been completed.

* * * * *